(12) United States Patent
Ogata et al.

(10) Patent No.: US 8,758,855 B2
(45) Date of Patent: Jun. 24, 2014

(54) COATING FILM FORMING APPARATUS, USE OF COATING FILM FORMING APPARATUS, AND RECORDING MEDIUM

(75) Inventors: Nobuhiro Ogata, Koshi (JP); Hiroichi Inada, Koshi (JP); Taro Yamamoto, Koshi (JP); Akihiro Fujimoto, Koshi (JP)

(73) Assignee: Tokyo Electron Limited, Tokyo (JP)

(*) Notice: Subject to any disclaimer, the term of this patent is extended or adjusted under 35 U.S.C. 154(b) by 7 days.

(21) Appl. No.: 13/424,011

(22) Filed: Mar. 19, 2012

(65) Prior Publication Data

US 2012/0183693 A1 Jul. 19, 2012

Related U.S. Application Data

(62) Division of application No. 12/106,747, filed on Apr. 21, 2008, now Pat. No. 8,186,298.

(30) Foreign Application Priority Data

May 7, 2007 (JP) ................................. 2007-122728

(51) Int. Cl.
*B05D 3/12* (2006.01)
*B08B 3/04* (2006.01)

(52) U.S. Cl.
USPC ............. 427/240; 427/352; 427/425; 118/52; 118/320; 134/33; 134/153; 134/157; 438/780; 438/782

(58) Field of Classification Search
USPC ................. 427/240, 425, 352; 118/52, 320; 134/33, 153, 157; 438/780, 782
See application file for complete search history.

(56) References Cited

U.S. PATENT DOCUMENTS

| 4,790,262 A | 12/1988 | Nakayama et al. |
| 5,312,487 A | 5/1994 | Akimoto et al. |
| 5,608,943 A | 3/1997 | Konishi et al. |
| 5,677,000 A | 10/1997 | Yoshioka et al. |
| 6,070,601 A | 6/2000 | Fang et al. |
| 2007/0082134 A1 | 4/2007 | Fukuda et al. |

FOREIGN PATENT DOCUMENTS

| JP | 5-234868 | 9/1993 |
| JP | 8-264412 | 10/1996 |
| JP | 2003-7669 | 1/2003 |
| JP | 2003-45788 | 2/2003 |

*Primary Examiner* — Kirsten Jolley
(74) *Attorney, Agent, or Firm* — Oblon, Spivak, McClelland, Maier & Neustadt, L.L.P.

(57) ABSTRACT

A coating film forming apparatus that holds a substrate upon a spin chuck and forms a coating film by supplying a chemical liquid upon a top surface of said substrate comprises: an outer cup provided detachably to surround the spin chuck; an inner cup provided detachably to surround a region underneath the substrate held upon the chuck; a cleaning nozzle configured to supply a cleaning liquid for cleaning a peripheral edge part of the substrate, such that the cleaning liquid is supplied to a peripheral part of a bottom surface of the substrate; a cutout part for nozzle mounting, the cutout part being provided to the inner cup to engage with the cleaning nozzle; and a cleaning liquid supply tube connected to the cleaning nozzle, the cleaning nozzle being detachable to the cutout part in a state in which the cleaning liquid supply tube is connected.

8 Claims, 13 Drawing Sheets

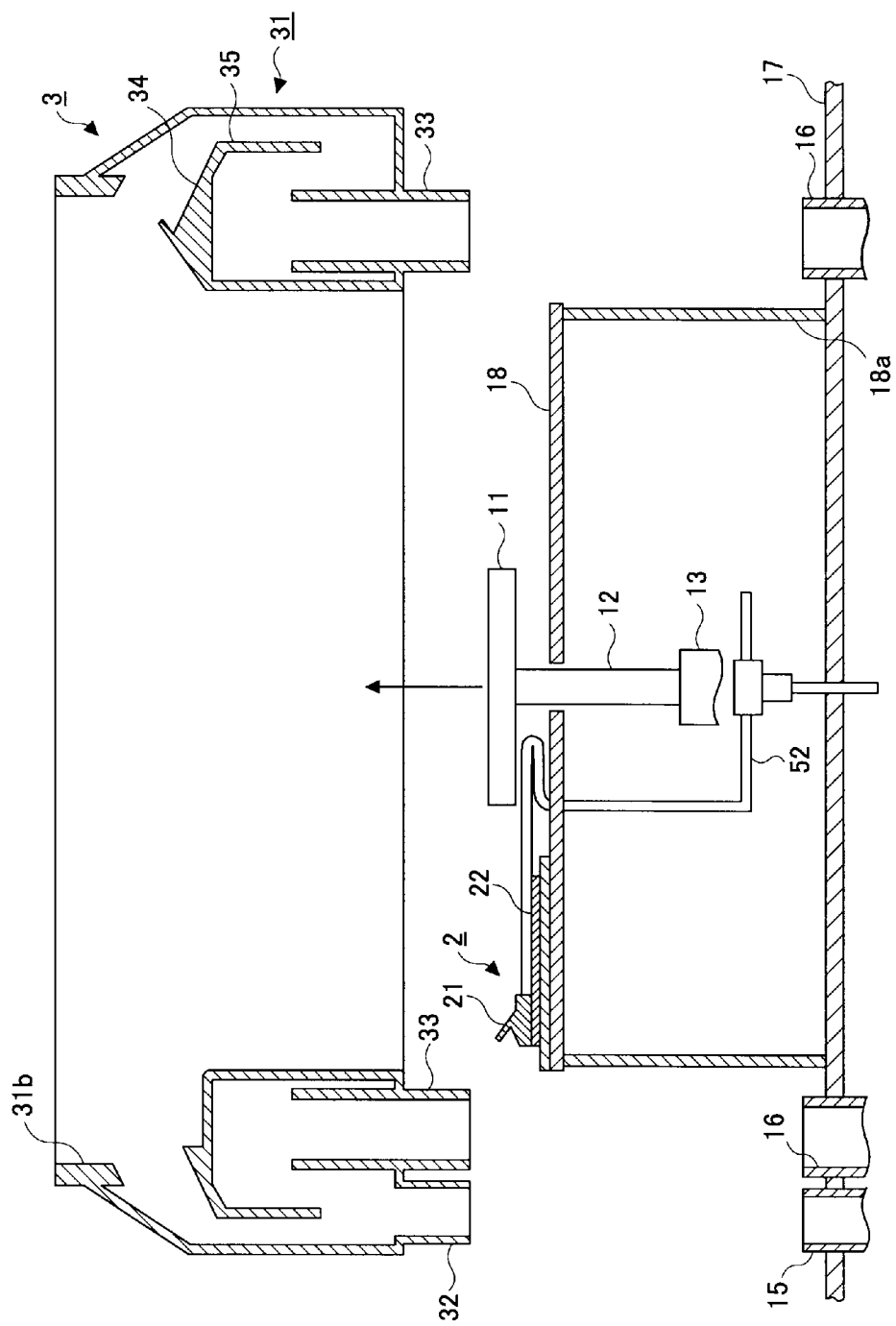

COATING FILM FORMING APPARATUS, USE OF COATING FILM FORMING APPARATUS, AND RECORDING MEDIUM

CROSS-REFERENCE TO RELATED APPLICATIONS

The present divisional application claims priority to application Ser. No. 12/106,747, filed Apr. 21, 2008 and claims priority to Japanese Patent Application 2007-122728, filed on May 7, 2007. The entire contents of application Ser. No. 12/106,747 and JP 2007-122728 are hereby incorporated herein by reference.

BACKGROUND OF THE INVENTION

The present invention relates to the technology of supplying a cleaning liquid to a bottom surface of a substrate after applying a chemical liquid to a top surface of the substrate.

The liquid treatment processing that applies a chemical liquid such as a resist liquid or a precursor of an insulation film upon a substrate such as a semiconductor wafer (referred to hereinafter as "wafer") is generally conducted by a spin-coating process in which the wafer is rotated at high speed such that the chemical liquid is extended over the wafer surface.

Patent Reference 1

Japanese Laid-Open Patent Application 8-264412, paragraph 0031 and FIG. 2

Patent Reference 2

Japanese Laid-Open Patent Application 2003-45788, paragraph 0031 and FIG. 7

DISCLOSURE OF THE INVENTION

In a first aspect, there is provided a coating film forming apparatus that holds a substrate upon a spin chuck and forms a coating film by supplying a chemical liquid upon a top surface of said substrate, said coating film forming apparatus comprising:

an outer cup provided detachably to surround said spin chuck;

an inner cup provided detachably to surround a region underneath said substrate held upon said chuck;

a cleaning nozzle configured to supply a cleaning liquid for cleaning a peripheral edge part of said substrate, such that said cleaning liquid is supplied to a peripheral part of a bottom surface of said substrate;

a cutout part for nozzle mounting, said cutout part being provided to said inner cup to engage with said cleaning nozzle; and a cleaning liquid supply tube connected to said cleaning nozzle, said cleaning nozzle being detachable to said cutout part in a state in which said cleaning liquid supply tube is connected.

Preferably, the cleaning nozzle is formed to have a shape corresponding to an outer shape of the inner cup such that the cleaning nozzle forms a part of the inner cup when mounted upon the cutout. Further, in the case of forming a mist blocking projection piece at the top edge of the inner cup in a circumferential direction thereof such that the mist blocking projection piece extends obliquely in the upward and outward directions, it is possible to use a part of the cleaning nozzle as a part of the foregoing projection piece. Further, in the case the top part of the inner cup is formed to have a mound-shape in the elevational cross-sectional diagram and the foregoing projection piece is constructed to extend outward from an apex of the mound-shape part, it is preferable to construct the cleaning nozzle to have an upward inclined oblique surface part and a downward inclined oblique surface part and such that the cleaning liquid is ejected from a part between these oblique surface parts.

Further, there may be provided a moving mechanism for moving the cleaning nozzle between a mounting position in which the cleaning nozzle is mounted upon the cutout part and a retracted position in which the cleaning nozzle is dismounted from the cutout part and is receded to inside of an inner edge of the inner cup. Further, it is preferable that the moving mechanism is constructed to retract the cleaning nozzle by way of at least one of a rotation operation and a slide operation thereof.

In another aspect, there is provided a using method of a coating film forming apparatus comprising an outer cup provided detachably to surround a spin chuck, an inner cup provided detachably to surround a region underneath a substrate held upon said spin chuck, said method comprising the steps of:

mounting a cleaning nozzle, to which a cleaning liquid supply tube is connected, upon a nozzle mounting cutout part provided to said inner cup in engagement therewith;

holding a substrate upon said spin chuck and forming a coating film by supplying a chemical liquid upon said substrate;

cleaning a peripheral edge part of said substrate by supplying a cleaning liquid from said cleaning nozzle to a peripheral part of a bottom surface of said substrate while rotating said spin chuck;

dismounting said cleaning nozzle from said inner cup in a state in which said cleaning liquid supply tube is connected thereto; and removing said inner cup.

Here, the cleaning nozzle is formed to have a shape corresponding to a shape of an outer surface of said inner cup such that said cleaning nozzle constitutes a part of said inner cup when mounted upon said cutout part. Further, in the case of forming the projection piece for blocking invasion of mist at the top edge of the inner cup so as to project outward and upward obliquely along the circumference of the inner cup, it is possible to form the cleaning nozzle such that a part of the cleaning nozzle functions as a part of the projection piece. Furthermore, in the case the top part of the inner cup is formed to have a mound-shape in the elevational cross-sectional diagram and the foregoing projection piece is constructed to extend outward from the apex of the mound-shape part, it is preferable to construct the cleaning nozzle to have an upward inclined oblique surface part and a downward inclined oblique surface part respectively functioning as a part of the oblique surface at the outer side of the mound part and as a part of the projection piece noted before, such that the cleaning liquid is ejected from a part between these oblique surface parts. Further, the step of removing the cleaning nozzle from the inner cup in the state a cleaning liquid supply tube is connected thereto may be conducted so as to retract the cleaning nozzle from the position in which the cleaning nozzle is mounted upon the cutout part of the inner cup to an inner position inside the inner periphery of the inner cup by way of at least one of a rotational operation and a sliding operation caused by a moving mechanism.

In another aspect, there is provided a recording medium storing a computer program configuring a general purpose computer to control a coating film forming apparatus, the coating film coating apparatus comprising a spin chuck provided in an outer cup and an inner cup provided so as to surround a region underneath a substrate held upon said spin chuck, the computer program including therein program steps for implementing the use of the coating film forming apparatus as set forth above.

According to the coating film forming apparatus of the present invention, in which there is provided a cutout part in an inner cup surrounding a region underneath a substrate held upon a spin chuck, it becomes possible to mount and dismount a cleaning nozzle by engaging and disengaging the cleaning nozzle to and from the cutout. Thereby, it becomes possible to supply a cleaning liquid from a location in the vicinity of the substrate peripheral edge part. As a result, the power of cleaning the peripheral edge part of the substrate is improved as compared with the conventional construction of supplying the cleaning liquid only from the central part of the bottom surface of the substrate. Thereby, it becomes possible to positively suppress the problems such as contamination of the wafer transfer arm, or the like.

Because the cleaning nozzle can be dismounted from the inner cup, mounting and dismounting of the inner cup at the time of maintenance such as cleaning of the inner cup is facilitated substantially, by removing the cleaning nozzle in advance.

BRIEF DESCRIPTION OF THE DRAWINGS

FIG. 9 is an elevational cross-sectional diagram showing the state in which the inner cup is removed from the coating film cleaning apparatus;

DETAILED DESCRIPTION OF THE PREFERRED EMBODIMENT

With conventional liquid treatment process, there sometimes arises a problem that the chemical liquid goes around the bevel part at the peripheral edge of the wafer and reaches a peripheral part of the wafer bottom surface. When this is caused, the liquid adhered to the bevel part tends to form particles upon drying and there are caused various problems such as contamination of the wafer transfer arm.

Figure 1A:
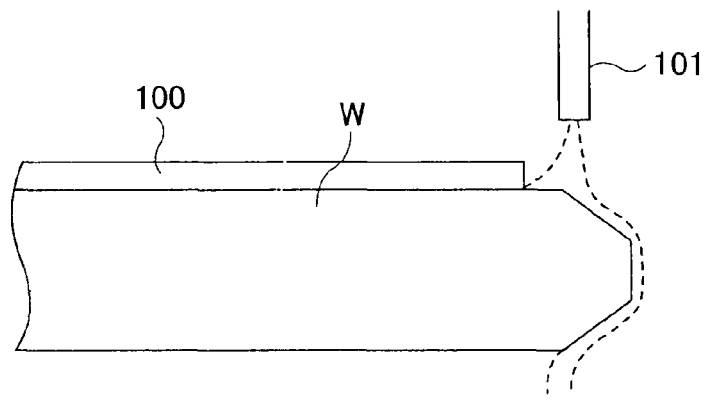
FIGS. 1A and 1B are diagrams explaining the cleaning process of a wafer peripheral part according to a related art.
Figure 1B:
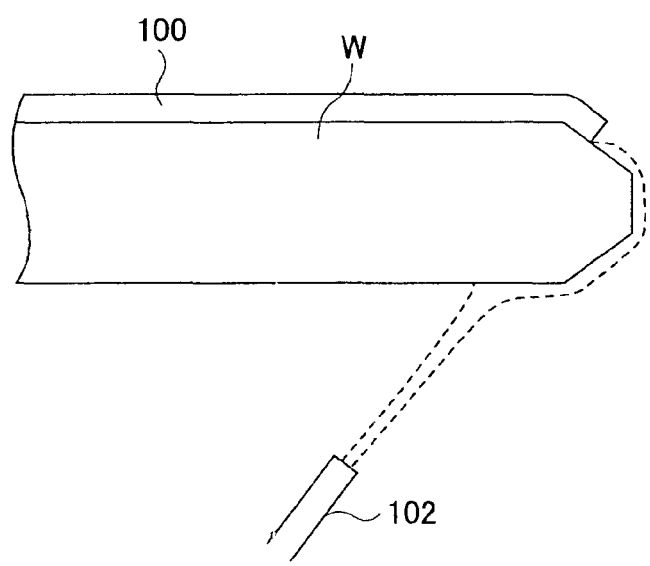

Thus, as shown in FIG. 1A, there is a proposal to clean a resist, for example, that has adhered to the peripheral part of the top surface of the wafer W and further the bevel part of the wafer W by ejecting a solvent from a nozzle 101. Further, there is a proposal to clean the bottom surface of the wafer W as shown in FIG. 1B by providing a nozzle 102 for cleaning the bottom surface underneath the wafer W by ejecting therefrom a solvent to the peripheral part of the bottom surface of the wafer W. Here, the reference numeral 100 indicates a resist film.

Meanwhile, in the fabrication process of semiconductor devices, there is a tendency to expand the device formation area on the wafer W toward the peripheral edge part thereof as much as possible. When the edge cleaning nozzle 101 shown in FIG. 1A is used, however, it will be noted that the resist film 100 is removed also from the region offset to the inner side by several millimeters from the bevel part of the wafer W, and it is no longer possible to leave the resist film 100 in the region near the bevel part, and hence in the region near the peripheral edge of the wafer.

Further, in these days, use of liquid immersion exposure process is studied for an exposure process, wherein a liquid immersion exposure process is a process that leaves water on the wafer at the time of the exposure process. When this approach is adopted, there are cases in which it becomes necessary to form a water repellant protective film in order to protect the resist film 100 at the time of the liquid immersion exposure process. Because formation of this protective film is carried out also by a chemical liquid treatment process, there is a need of removing the protective film from the part in which such a protective film is not necessary. However, because it is necessary to form the protective film to the wafer peripheral edge, there arises a situation in which the use of the edge cleaning nozzle 101 is difficult. Further, there also exists a desire to avoid providing the edge cleaning nozzle 101 in view of the cost thereof.

On the other hand, in the case the nozzle 102 for cleaning the bottom surface as shown in FIG. 1B is used, there arises a problem that it becomes difficult to ensure cleaning by causing the cleaning liquid supplied from the rear side to go around and reach the top side of the bevel part of the wafer W.

It should be noted that there is provided an inner cup underneath the wafer W along the peripheral part of the bottom surface of the wafer W so as to direct the mist of the coating liquid scattered at the time of the spin coating process to an exhaust path. Thus, it is necessary that the nozzle 102 for cleaning the bottom surface is provided at the inner side of this inner cup. Thus, the location of supply of the solvent from the nozzle 102 is offset to the inner side from the bevel part, and it becomes difficult to cause the solvent to reach the bevel part.

Further, in the case there is applied a hydrophobizing processing to the wafer W for improving the adhesion of the resist film 100 at the time of applying the resist film 100, there is a possibility that a part of the gas used for the processing goes around and reaches the bottom side of the wafer W. There, the peripheral part of the bottom surface of the wafer W undergoes hydrophobizing. It is confirmed, with the wafer W of such a state, that the cleaning liquid supplied from the nozzle 102 for cleaning the bottom surface experiences repelling by the region thus caused hydrophobizing, and it becomes more difficult to carry out the cleaning of the bevel part. As noted before, the nozzle 102 is offset considerably toward the inner side from the bevel part.

As the means of solution of these problems explained with reference to FIGS. 1A and 1B, it may also be conceivable to form a supply nozzle of the cleaning liquid by forming an aperture to the inner cup explained before and supply the cleaning liquid from the location near the bevel part at the bottom side of the wafer W.

However, it should be noted that the inner cup has to be dismounted from the coating film forming apparatus periodically such as once in a week for maintenance work such as cleaning the resist liquid adhered to the inner surface of the inner cup. Thus, when a supply nozzle of a cleaning liquid is provided to the inner cup, it becomes necessary, at the time of the maintenance work, to disconnect and further connect a line of the cleaning liquid from and to the cleaning nozzle. Thereby, the maintenance work becomes inevitably complicated.

Further, Patent Reference 1 and Patent Reference 2 describe the technology of supplying a cleaning liquid to the wafer W on the spin chuck from the bottom side thereof for removal of the coating film coated upon the surface of the wafer W at the peripheral part thereof. However, the technology recited in Patent Reference 1 is entirely silent about the problem that the inner cup provided at the bottom side of the wafer W becomes an obstacle at the time of cleaning the bevel part. Naturally, Patent Reference 1 does not provide any solution to this problem. Further, with the technology described in Patent Reference 2, it should be noted that the member corresponding to the inner cup has a shape different from the member used in the coating film forming apparatus to be described later with reference to the embodiment of the present invention, and thus, the technology of Patent Reference 2 cannot be used as the technology for eliminating the problem of degradation of easiness of maintenance at the time of removing the inner cup.

The present invention has been made in view of the situations and circumstances noted heretofore and it is an object of the present invention to provide a coating film forming apparatus, which is easy for maintenance and at the same time has a high cleaning power for cleaning the peripheral part of the substrate. Further, the present invention provides the use of such a coating film forming apparatus and a recording medium that stores a computer program of such a method of using the coating film forming apparatus.

Next, the present invention will be described with reference to FIGS. 2 and 3 for the embodiments in which the coating film forming apparatus of the present invention is used for a coating unit that applies a resist liquid upon a wafer W as a coating liquid (chemical liquid) by way of a spin coating process. Here, it should be noted that FIG. 2 shows a coating film forming apparatus 1 in an elevational cross-sectional view while FIG. 3 is an oblique view diagram showing an external appearance of an inner cup 34 provided to the coating film forming apparatus 1.

Figure 2:
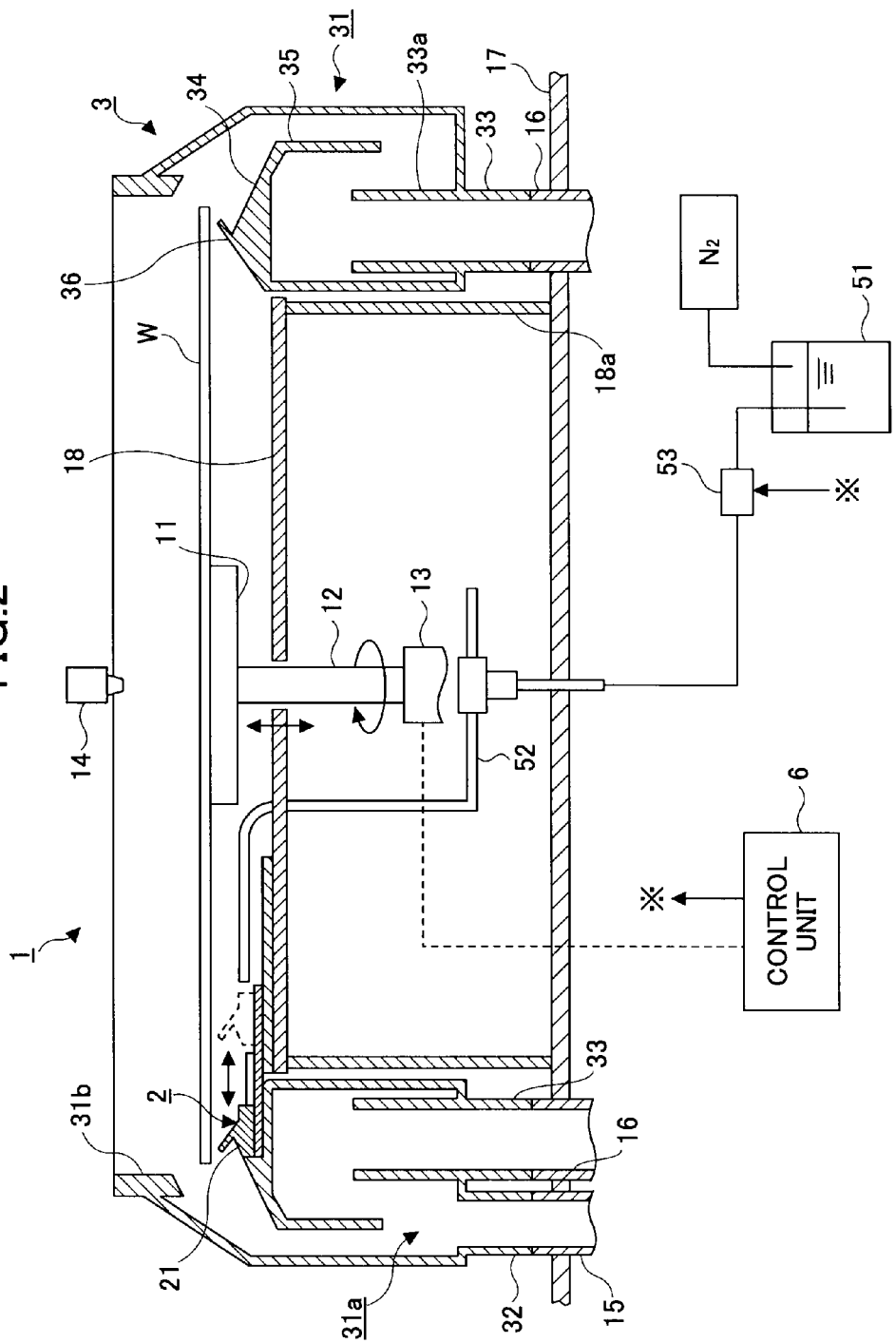
FIG. 2 is an elevational cross-sectional diagram showing the construction of a coating film forming apparatus according to an embodiment.
Figure 3:
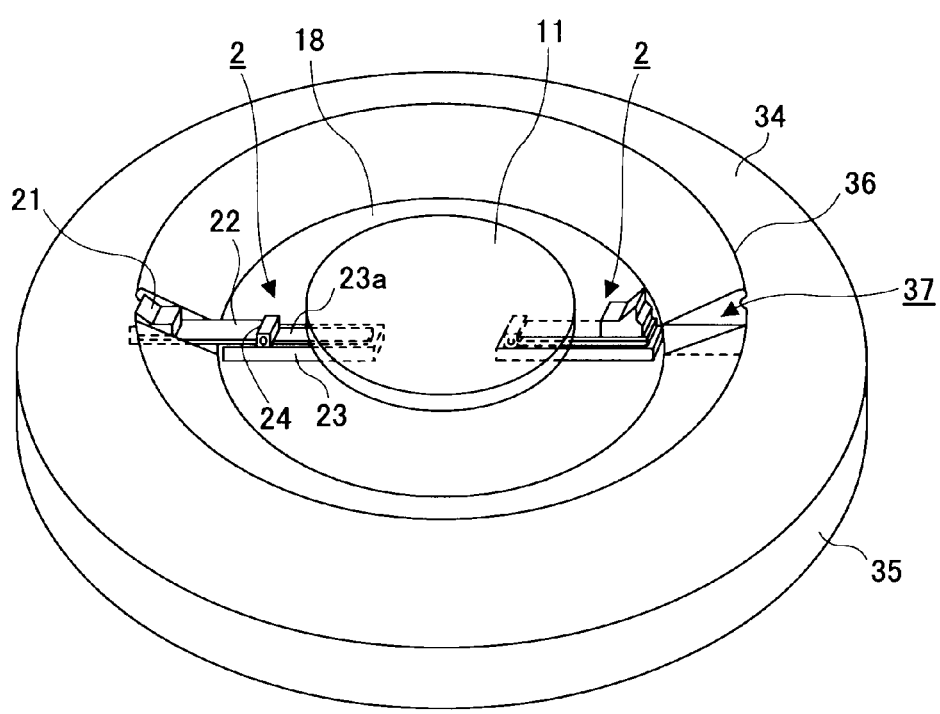
FIG. 3 is an oblique view diagram showing an outside view of the inner cup mounted upon the foregoing coating film forming apparatus.

As shown in FIG. 2, the coating film forming apparatus 1 includes a spin chuck 11 sucking a central part of the bottom surface of a wafer W to be processed and holding the wafer W horizontally, a supply nozzle 14 for supplying a resist liquid upon a top surface of the wafer W, and a cup body 3 for suppressing scattering of the mist of the resist liquid from the top surface of the wafer W. These devices are accommodated in a housing not illustrated in which a down flow of a purified air is formed.

The spin chuck 11 is connected to a drive mechanism (spin chuck motor) 13 via a shaft part 12 and is constructed to rotate in the clockwise direction for example when viewed from the top side thereof in the state in which the wafer W is held thereon. Further, the spin chuck 11 is movable up and down while holding the wafer W thereon. The wafer W is transported to the coating film forming apparatus by means of a transfer arm and is transferred upon the spin chuck 11 by a cooperating movement of lifter pins (not illustrated), which are provided at a lateral side of the spin chuck 11.

The supply nozzle 14 faces a central part of the top surface of the wafer W and functions to supply a resist liquid supplied thereto from a supply unit not illustrated such that the resist liquid is further supplied to the top surface of the wafer W. During the interval in which supply of the resist liquid is not made, the supply nozzle 14 is retracted from the location over the wafer W, and with this, interference to the transfer operation of the wafer W by the transfer arm, or the like, is avoided.

The cup body 3 performs the role of preventing the mist formed at the time of the spin coating process of the wafer W with rotation thereof from causing scattering and further the role of discharging the mist or drain to the outside of the coating film forming apparatus 1. The cup 3 includes an outer cup 31 having a double cylinder structure of donuts shape, and an inner cup 34 is provided upon an inner cylinder forming a part of this outer cup 31. As shown in FIG. 2, the outer cup 31 surrounds the spin chuck 11, wherein the circumferential surface of the outer cup 31 has a top edge part tilted to an inner side, and there is provided a restriction member 31b at the tip end of the tilted top edge part for straightening the direction of air flow into the cup body 3.

On the other hand, at the bottom side of the outer cup 31, there is formed a concaved liquid catching part 31a, wherein the liquid catching part 31a is provided with a drain port 32 at the bottom surface thereof for discharging the drain of the resist liquid. Further, there are provided two evacuation ports 33 for evacuating the air flow, which has passed through the cup body 3.

These ports 32 and 33 are connected respectively to a drain line 15 and an evacuation line 16, and with this, the drain of the resist liquid and the air flow containing the mist are evacuated from the coating film forming apparatus 1.

Here, it should be noted that the evacuation port 33 extends upward in the outer cup 31 and forms an overflow blocking wall 33a blocking the overflow of the drain from the outer cup 31 to the evacuation line 16.

Further, as shown in FIGS. 2 and 3, there is provided a disc plate 18 at the lower side of the spin chuck 11 so as to surround the shaft part 12 of the spin chuck 11, and an inner cup 34 is disposed around the disc plate 18 in a ring-shaped form.

Further, it should be noted that the inner cup 34 has a top part having a mound-like cross-sectional shape, wherein there extends a projection piece 36 from the apex of the mound-shaped top part, and thus from the top edge of the inner cup 34, such that the projection piece 36 extends obliquely in the upward and outward directions. It should be noted that this projection piece 36 functions to disconnect the bottom surface of the wafer W held upon the spin chuck 11 from the space inside the cup body 3 and to suppress the inflow of the mist, which is flowing through the cup body 3, into the bottom side of the wafer W.

In the state the wafer W is held upon the spin chuck 11, the inner cup 34 is provided to surround the region underneath the wafer W, wherein it should be noted that the inner cup 34 is constructed such that the distance between the bottom surface of the wafer W and the tip end part of the projection piece 36 falls in the range of 1.0-1.5 mm. Further, as shown in FIG. 3, there are formed two cutout parts 37 upon the top surface of the projection piece 36 forming the mound-like shape, such that the two cutout parts 37 oppose with each other in a diametric direction of the inner cup 34. It should be noted that the cutout parts 37 are formed such that a cleaning nozzle 21 can be mounted thereupon as will be described later.

At the outer edge surface of the inner cup 34, there is provided an end plate 35 extending in the downward direction so as to enter the liquid catching part 31a of the outer cup 31 as shown in FIG. 2. Thus, a part of the resist liquid scattered from the wafer W is guided to the liquid catching part 31a as a drain along the inner cup 34 and further along the surface of the end plate 35. The disc plate 18 is supported by a support member 18a having a cylindrical form, wherein the support member 18a can be inserted into the inner side of the donuts-shaped cup body 3. Thus, the shaft part 12 of the spin chuck 11 and further a spin chuck motor 13, and the like, are accommodated into the interior of the support member 18a.

Further, the drain line and the evacuation liner 16 are fixed upon a bottom plate 17 constituting the housing noted already, and each of the ports 32 and 33 has a shape capable of engaging with a corresponding line 15 or 16. At the time of maintenance work such as cleaning of the cup 3, the drain port 32 or the evacuation port 33 are disconnected from the line 15 or 16. Thereby, it becomes possible to take out the cup body 3 from the coating film forming apparatus 1 by lifting up the whole cup body 3 in the upward direction from the spin chuck 11. Thus, the outer cup 31 and the inner cup 34 are formed detachable with regard to the coating film forming apparatus 1.

Further, the coating film forming apparatus 1 of the present embodiment includes a bevel cleaning mechanism 2 for removing the resist liquid adhered to the bevel part at the peripheral edge part of the wafer W, for preventing contamination of the transfer arm, or the like.

As shown in FIG. 3, this bevel cleaning mechanism 2 includes a cleaning nozzle 21 for supplying a cleaning liquid, which may be a solvent for example, to the peripheral part of the bottom surface of the wafer W, an arm part 22 for moving the cleaning nozzle 21, and a base 23 supporting the arm part 22 and providing the moving path of the arm part 22, wherein the arm part 22 and the base 23 are connected with each other by a connection member 24.

Figure 5A:
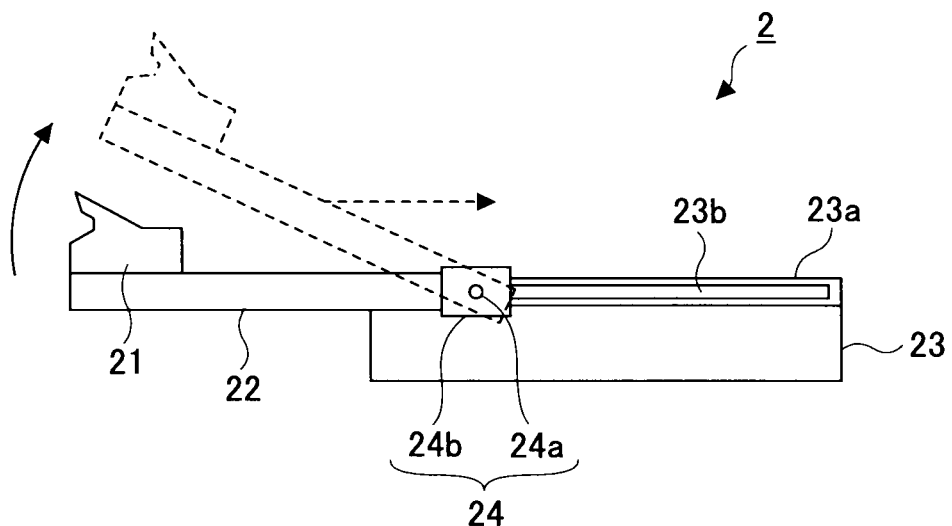
FIGS. 5A and 5B are side view diagrams showing the construction and operation of a cleaning mechanism equipped with the foregoing cleaning nozzle.

The base 23 is formed to have a shape of elongated block, and there is formed a rail 23a on the top surface thereof, wherein the rail 23a provides a moving path of the arm part 22. As shown in FIG. 5A, there are formed elongated slits 23b at the both lateral sides of the rail 23a, such that a connection pin 24a of a connection member 24 causes a sliding movement in the slit 23b.

The arm part 22 is formed to have the shape of elongated block similarly to the base 23 described already such that there is formed a cavity inside the arm part 22, wherein the cavity is opened at the bottom side thereof, and with this, it becomes possible for the cavity to accommodate the rail 23a therein for the entirety thereof. The arm part 22 is fixed with the cleaning nozzle 21 at the top surface of the tip end part, while the base part of the arm part 22 is connected to the base 23 via the connection member 24. The connection member 24 is constituted of a holding member 24b of U-shaped form and the connection pin 24a noted previously, wherein the connection pin 24a penetrates through the slits 23b and have the both ends thereof fixed upon the respective sidewall surfaces of the holding member 24b, which is disposed so as to cover the top surface of the base 23.

Figure 5B:
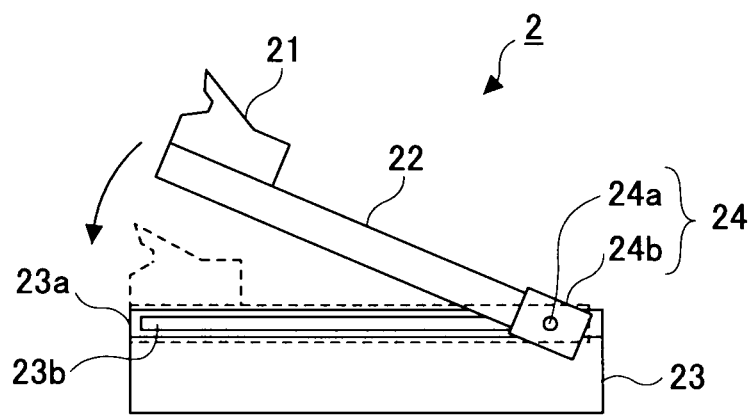

By fixing the base part of the arm part 22 upon the inner side of the holding member 24b such that the connection pin 24a is movable right and left along the slit 23b and such that the connection pin 24a is rotatable, the arm part 22 forms a movable mechanism movable to the right and left as shown in FIGS. 5A and 5B and is movable up and down at the tip end part thereof about the rotational axis, which is coincident to the connection pin 24a.

Figure 4A:
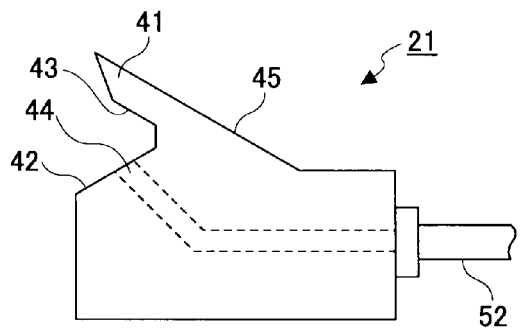
FIGS. 4A-4C are diagrams showing the construction of a cleaning nozzle mounted upon the foregoing inner cup.
Figure 4B:
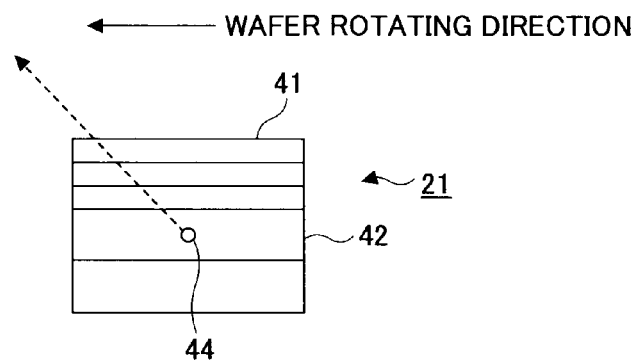
Figure 4C:
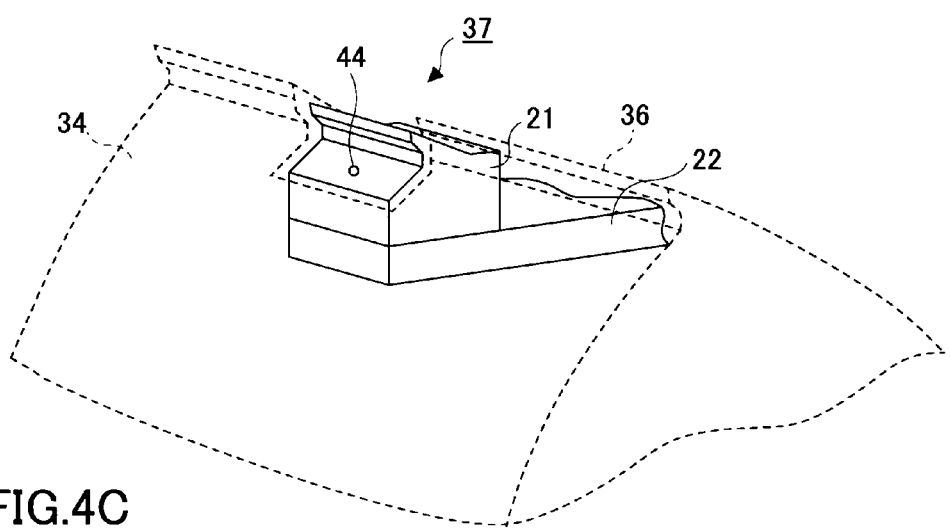

Next, the construction of the cleaning nozzle 21 will be explained with reference to FIGS. 4A-4C. FIG. 4A is a side view of the cleaning nozzle 21 while FIG. 4B is a front view thereof. Further, FIG. 4C is an oblique view diagram showing the state in which the cleaning nozzle 21 is mounted upon the cutout part 37 of the inner cup 34. Hereinafter, the explanation of the bevel cleaning mechanism 2 will be made based on the orientation system in which the front side is defined as the outward direction of the inner cup 34.

As shown in FIGS. 4A and 4B, the cleaning nozzle 21 is a small block of a mound-shape having oblique surfaces 42 and 45 at the top part thereof, wherein there is formed a nozzle projection piece 41 by a part of the rear oblique surface 45 extending in the forward direction. Thereby, the cleaning nozzle 21 can be mounted in the state a cleaning liquid supply tube 52 to be described later is connected thereto, by engaging the cleaning nozzle 21 with the cutout part 37 of the inner cup 34 as show in FIG. 4C. The cleaning nozzle 21 is formed to have a shape corresponding to the shape of the inner cup 34 so as to constitute a part of the inner cup 34 in the mounted state. Thereby, the nozzle projection piece 41 functions as a projection piece 36 of the inner cup 34.

Designating now the oblique surface 42 at the front side of the mound shown in FIG. 4A as "upward inclined oblique surface part" and the oblique surface 43 located underneath the nozzle projection piece 41 as "downward inclined oblique surface", it should be noted that these upward inclined oblique surface 42 and the downward inclined oblique surface 43 respectively form a part of the outer oblique surface of the inner cup 34 and a part of the projection piece 36 of the inner cup 34. Further, at the central part of the upward inclined oblique surface part 42 between the oblique surface parts 42 and 43, there is provided a supply aperture 44 as shown in FIG. 4B. With this, the nozzle 21 can eject the cleaning liquid in the leftward-upward direction when viewed from the front direction, and hence in the rotating direction of the spin chuck 11. Further, in the case the trajectory of the ejected cleaning liquid causes interference with the nozzle projection piece 41, it is also possible to provide a cutout to the nozzle projection piece 41 at the interfering location.

The supply aperture 44 of the cleaning nozzle 21 is connected to a cleaning liquid tank 51 via a cleaning liquid supply tube 52, wherein the cleaning liquid is pushed out from the cleaning liquid tank 51 by supplying thereto an inert gas such as a nitrogen gas, or the like. Thereby, the cleaning liquid is supplied to the supply aperture 44 with flow rate control by a flow rate controller 53 provided on the cleaning liquid supply tube 52.

In the side above the disc plate 18, in which there is caused movement or rotation in the arm part 22, it should be noted that the cleaning liquid supply tube 52 is formed for example by a flexible tube, or the like, with ample margin such that the cleaning liquid supply tube 52 does not obstruct the movement of the arm part 22. For the sake of convenience, illustration of the cleaning liquid supply tube 52 is omitted in the drawings of FIG. 3 and later.

For example, there are provided two such bevel cleaning mechanisms 2 having the foregoing construction over the disc plate 18 at both edge parts thereof in the state that the cleaning nozzle 21 is directed in the outward direction along the line passing through the center of the disc plate 18.

By extending the arm part 22 toward the front side, it becomes possible to mount the cleaning nozzle 21 upon the cutout part 37 of the inner cup 34. Thereby, the cleaning nozzle 21 is located in the vicinity of the bevel part of the wafer W held upon the spin chuck 11 (hereinafter, this position is called "mounting position"). When the arm part 22 is receded to the backward position, on the other hand, it becomes possible to retract the cleaning nozzle 21 to a position at the inner side of the inner edge of the inner cup 34 where the cleaning nozzle 21 causes no interference with the inner cup 34 at the time of mounting and dismounting of the cup position 3 (this position will be called hereinafter as "retracted position").

In the elevational cross-sectional diagram of FIG. 2, it should be noted that there are indicated, for the sake of convenience of explanation, both the cross-section where the bevel cleaning mechanism 2 is in position and the cross-section where the bevel cleaning mechanism 2 is out of the position. Thereby, illustration of the bevel cleaning mechanism 2 at the right side is omitted. Further, in the illustration of FIG. 2, it should be noted that a part of the cleaning supply tube 52 connected to the cleaning nozzle 21 is omitted in view of the convenience of illustrating the cleaning nozzle 21 at the mounting position and at the retracted position.

As shown in FIG. 2, the spin chuck motor 13, the bevel cleaning mechanism 2, the flow rate controller 53 of the cleaning liquid, the supply unit of the resist liquid not illustrated, and the like are connected to a control part 6. The control part 6 is formed of a computer including a central processing unit (CPU) and a program related to various operations of the units provided to the coating film forming apparatus 1. It should be noted that this program includes a set of control steps (instructions) executed consecutively according to a predetermined schedule and pertaining to the control of: supply timing and supply amount of the resist liquid; rotational speed and rotation duration of the spin chuck 11; supply timing and supply amount of the cleaning liquid, and the like. This program is stored in a recording medium such as a hard disk, compact disk, magneto-optical disk, memory card, or the like, and is installed to a computer therefrom.

Hereinafter, the operation of the coating film forming apparatus 1 according to the present embodiment will be explained based upon the construction explained heretofore.

The wafer W transported to a position over the spin chuck 11 by an external transfer arm not illustrated is transferred to the spin chuck 11 as a result of cooperation of the transfer arm and the lifter pins explained before. Further, as shown in the schematic diagram of FIG. 6A, the supply nozzle 14 is moved over the central part of the wafer W held upon the spin chuck 11 and supply of the resist liquid is started.

Figure 6A:
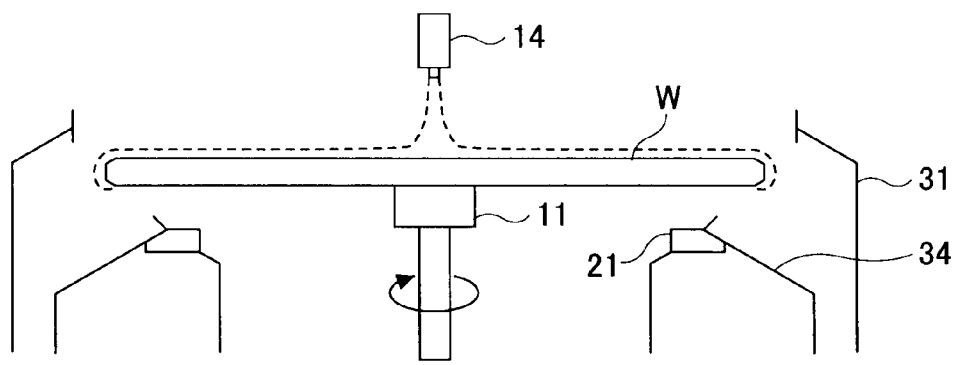
FIGS. 6A and 6B are diagrams explaining the operation of the coating film forming apparatus at the time of formation process of a coating film.
Figure 6B:
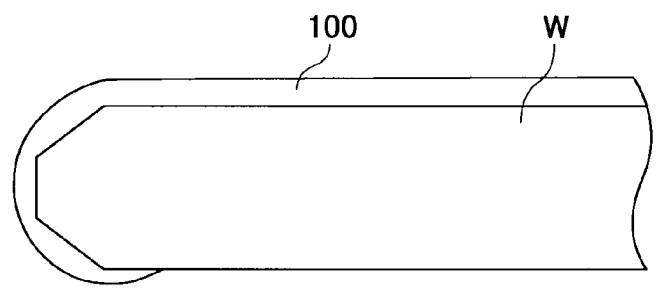

Next, while supplying the resist liquid upon the surface of the wafer W, the wafer W is rotated and a spin coating process is conducted. Thus, the resist liquid is spread in the radial direction of the wafer W as represented in FIG. 6A. After stopping the supply of the resist liquid, the wafer W is rotated further, and the resist liquid thus coated is thrown off, followed by drying. With the operation noted above, there is formed a resist film 100 on the surface of the wafer W as shown in the enlarged view diagram of FIG. 6B as a coating film. In such formation of the resist film 100, there occurs move around of the resist film as explained previously, and thus, there is caused formation of the resist film 100 such that the resist film 100 converts also the bevel part and further the peripheral part of the wafer W at the bottom surface thereof as shown in the enlarged diagram above.

Figure 7A:
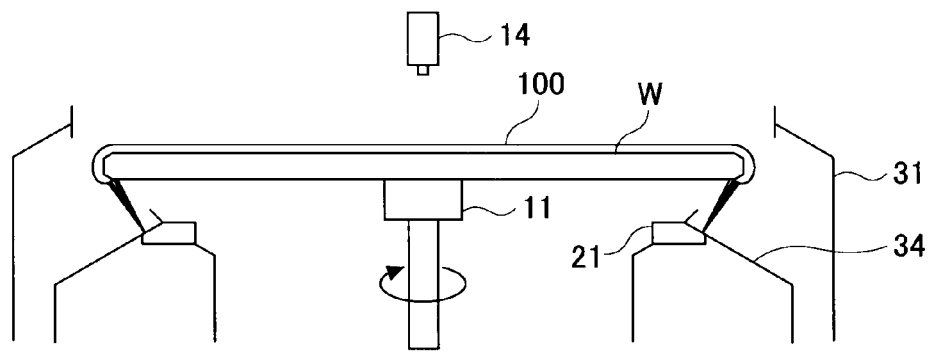
FIGS. 7A-7C are diagrams explaining the operation of the coating film forming apparatus at the time of a bevel cleaning process.

Thus, as shown in the schematic diagram of FIG. 7A, the wafer W is rotated for several seconds at the rotational speed of 700 rpm, for example, and the resist film 100 is removed from the bevel part by supplying the cleaning liquid from the cleaning nozzle 21 located in the vicinity of the bevel part at the under side thereof. There, the cleaning liquid is ejected upward and obliquely in the same direction of the rotational direction of the wafer W as indicated in FIG. 4B. By supplying the cleaning liquid in the same direction of the rotational direction of the wafer W, it becomes possible to suppress the problem that the cleaning liquid is scattered around by the impact to the wafer W. Further, it should be noted that the cleaning liquid is supplied so as to aim a position 4 mm inside of the peripheral edge of the wafer W. With this, it becomes possible to avoid scattering of the cleaning liquid by the notch (having a depth of about 2 mm) provided to the peripheral edge of the wafer W.

Figure 7B:
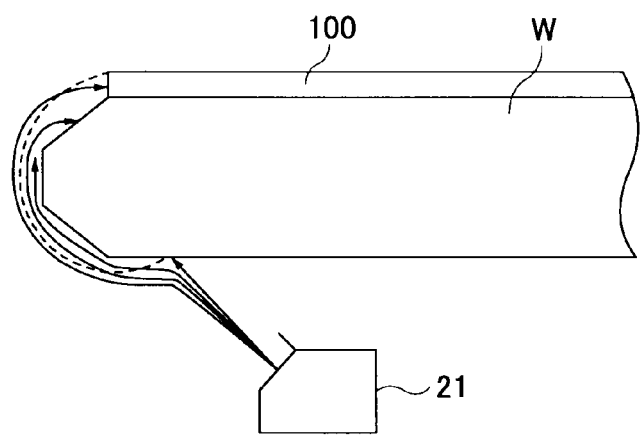

Thus, by supplying the cleaning liquid from the underside of the wafer W as shown in FIG. 7B, the cleaning liquid thus supplied spreads from the rear surface of the bevel part to the side surface of the wafer W and further to the top surface, and the resist film 100 is removed from these regions. It is confirmed experimentally that a resist film 100 that expands to the vicinity of the peripheral edge of the wafer W excluding the bevel part is obtained.

Figure 7C:
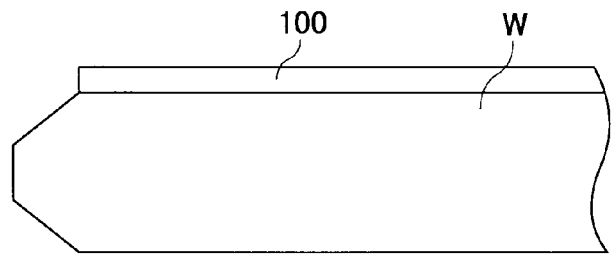

Here, the reason why it is possible to remove the resist film 100 from the side surface and also from the top surface of the bevel part in spite of the fact that the cleaning liquid is supplied from the bottom side will be considered. The cleaning liquid supplied from the cleaning nozzle 21 spreads over the bottom side of the bevel part of the wafer W as a result of the action of the ejection pressure thereof and the centrifugal force associated with the rotation of the wafer W. There, the cleaning liquid dissolves the resist film 100 at the pertinent region and there is formed a mixed solution of the cleaning liquid and the resist liquid at the top surface of the wafer W. Because the cleaning liquid is continuously supplied from the cleaning nozzle 21, the cleaning liquid thus supplied undergoes diffusion through the solution, and with this, the resist film at the contact interface to the solution undergoes dissolving. As a result, the cleaning liquid goes around the side surface starting from the bottom side of the bevel part and reaches the top side thereof. Thereby, the resist film 100 is removed from these regions. On the other hand, because a centrifugal force works upon the rotating wafer W as noted above, it should be noted that the cleaning liquid cannot remove the resist film further when the solution has been scattered from the surface of the wafer W by the centrifugal force. Thus, it is believed that the resist film 100 is obtained such that the resist film is removed from the superfluous region of the bevel part as shown in FIG. 7C as a result of the balance of the mutually contradicting functions of the cleaning liquid dissolving the resist film 100 at the contact interface to the solution and the solution causes scattering from the surface of the wafer W.

Further, the wafer W is rotated for 5 seconds for example with the rotational speed of 2000 rpm for example, and the wafer is dried after the casting-off of the cleaning liquid. With this, the liquid treatment is completed. The wafer W coated with the resist liquid is then brought out from the coating film forming apparatus 1 by being transferred to the transfer arm with a reverse order to the case of bringing the wafer into the coating film forming apparatus 1.

In the operation explained heretofore, it should be noted that there is formed an air flow in the space between the outer cup 31 and the inner cup 34 in the downward direction so as to discharge the mist of the resist liquid or the cleaning liquid formed as a result of casting-off caused by the rotation of the wafer W, to the outside. Thereby, it should be noted that the air flow containing such mist tends to flow to the bottom side of the wafer W as a result of a part of the air flow being captured by the rotational movement, or the like, of the wafer W. With the present embodiment, on the other hand, the top part of the inner cup 34 is formed to have a mound shape such that the gap between the wafer W and the inner cup 34 is narrowed. Thus, invasion of the captured air flow to the bottom side of the wafer W is effectively retarded. Further, because the projection piece 36 extends obliquely in the upward and outward directions from the apex of mound-shape part, the projection piece 36 functions to change the direction of the captured air flow in the outward direction. As a result, the air flow containing the mist is blocked by the mound-shape part or the nozzle projection piece 41, and invasion of the air flow to the bottom side of the wafer W as shown by a broken line in FIG. 8 becomes difficult. Thereby, deposition of the mist of the resist liquid, or the like, upon the bottom surface of the wafer W is effectively suppressed.

Figure 8:
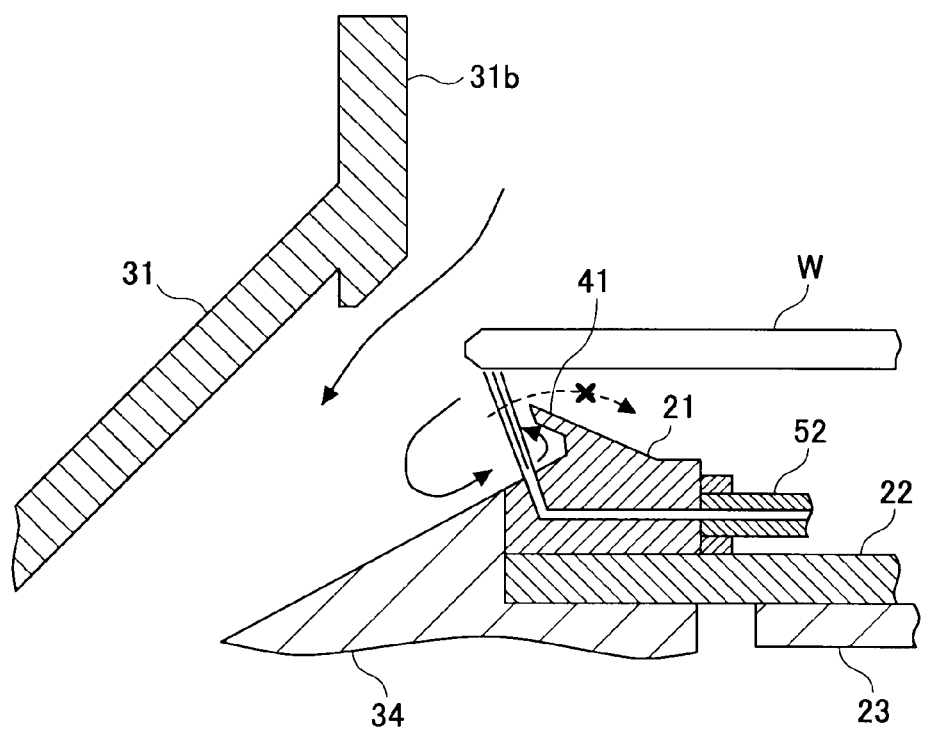
FIG. 8 is a second diagram showing the operation of the coating film forming apparatus at the time of the bevel cleaning process.

Further, with the present embodiment, in which the cleaning nozzle 21 engaged with the cutout part 37 of the inner cup 34 forms a part of the foregoing mound-shape part or the projection piece 36 as shown in FIG. 8, the problem of invasion of the mist-containing air flow to the bottom side of the wafer W is effectively suppressed similarly to other regions at the top part of the inner cup 34.

Next, the function of the bevel cleaning mechanism 2 at the time of maintenance of the cup body 3 will be explained. During the interval in which the liquid treatment of the wafer W is not made in the coating film forming apparatus 1, as in the interval in which a coating and developing apparatus equipped with the foregoing coating film forming apparatus 1 is not operating, it is possible to take out the cup body 3 from the coating film forming apparatus 1 as shown in FIG. 9 for the purpose of maintenance such as cleaning. In such a case, the operator lifts up the cleaning nozzle 21 from the mounting position by rotating the arm part 22 of the bevel cleaning mechanism 2 in the upward direction as shown in FIG. 5A, and the cleaning nozzle 21 is moved in the backward direction while maintaining the same lifted state. Thereafter, the arm part 22 is rotated in the downward direction as shown in FIG. 5B, wherein the cleaning nozzle 21 is held at a stand-by position shown in the same drawing by a broken line.

In the foregoing stand-by position, the cleaning nozzle 21, the arm part 22, and the like, of the bevel cleaning mechanism 2 is retracted to an inner side of the inner edge of the inner cup 34 as shown in FIG. 9, and thus, it becomes possible to remove the cup body 3 freely after retracting the cleaning nozzles 21 for both two bevel cleaning mechanisms 2, without carrying out any complicated work such as disconnection of the cleaning liquid supply tube 52. After mounting the cup body 3 again upon the coating film forming apparatus 1 after completion of maintenance work of the cup body 3, the two bevel cleaning mechanisms 2 are operated in the opposite sequence as in the case of retraction noted before, and the cleaning nozzle 21 is mounted upon the inner cup 34. In FIG. 3, the bevel cleaning mechanism 2 at the left side is shown in the state in which the cleaning nozzle 21 is moved to the mounting position and the bevel cleaning mechanism 2 at the right side is shown in the state in which cleaning nozzle 21 is moved to the retracted position, while it should be noted that this is merely for the sake of convenience of explanation. In the actual operation, these two bevel cleaning mechanisms 2 move the respective cleaning nozzles 21 with the same timing to the mounting position, when the cup body 3 is in use, and to the retracted position at the time of the maintenance operation.

According to the coating film forming apparatus 1 of the present embodiment described heretofore, the following advantageous effects are attained. Because the cutout part 37 is provided in the inner cup 34 that surrounds the region underneath the substrate W, which in turn is held upon the spin chuck 11, it becomes possible to mount and dismount the cleaning nozzle 21 by engaging and disengaging the cleaning nozzle 21 to and from the cutout 37. Thereby, it becomes possible to supply the cleaning liquid from a location in the vicinity of the bevel part of the substrate. As a result, the power of cleaning the bevel part of the substrate is improved as compared with the conventional construction of supplying the cleaning liquid only from the central part of the bottom surface of the wafer W. Thus, it becomes possible to positively suppress the problems such as contamination of the wafer transfer arm, or the like. It is of course possible to carry out the cleaning of the bottom surface of the wafer W by using the conventional cleaning nozzle 102 for cleaning the bottom surface provided at an inner position of the inner cup 34 concurrently to or before or after the bevel part cleaning conducted by using the cleaning nozzle 21 of the present embodiment.

Further, it should be noted that, because the top part of the inner cup 34 has a mound-shape cross-sectional form and the projection piece 36 extends from the apex of the mound-shape part in the upward and downward directions, it becomes possible to suppress the invasion of the air flow containing the mist of the resist liquid, or the like, into the bottom side of the wafer W. Further, because the upward inclined oblique surface part 42 and the downward inclined oblique surface part 43 function respectively as a part of the inclined surface at the outer side of the inner cup 34 and a part of the projection piece 36, the effect of blocking the invasion of the air flow containing the mist is not degraded in the part where the cleaning nozzle 21 is mounted. As a result of these, too, it becomes possible to suppress the adhesion of the resist liquid or the like to the bottom surface of the wafer W, and it becomes possible to suppress the occurrence of contamination of the transfer arm, or the like. Because the cleaning nozzle 21 has a size much smaller than the length of the top edge of the inner cup 34, it is also possible to obtain the effect of considerably suppressing the invasion of the air flow containing the mist to the rear surface of the wafer W, even in the case of using the cleaning nozzle 21 not equipped with the nozzle projection piece 41. However, it is preferable to provide the nozzle projection piece 41 to the cleaning nozzle 21 whenever it is possible.

Because the cleaning nozzle 21 can be dismounted from the inner cup 34, mounting and dismounting of the cup body 3 at the time of maintenance such as cleaning of the cup body 3 is facilitated substantially, by removing the cleaning nozzle 21 in advance. Particularly, because the bevel cleaning mechanism 2 of the present embodiment has the moving mechanism for moving the cleaning nozzle 21 between the mounting position and the retracted position, there is no need for the operator to mount or dismount the cleaning nozzle 21, and handing of the apparatus becomes much easier.

While the embodiment of FIGS. 2-8 has been explained for the bevel cleaning mechanism 2 equipped with the moving mechanism for causing slide movement of the cleaning nozzle 21 between the mounting position and the retracted position, it should be noted that the construction of the moving mechanism or the retracted position is not limited to those explained in the foregoing embodiment.

Figure 10A:
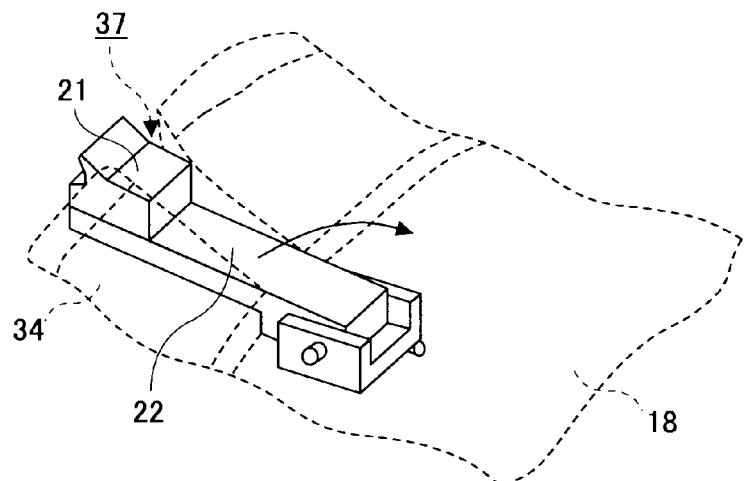
FIGS. 10A-10C are oblique view diagram showing a modification of the cleaning mechanism.
Figure 10B:
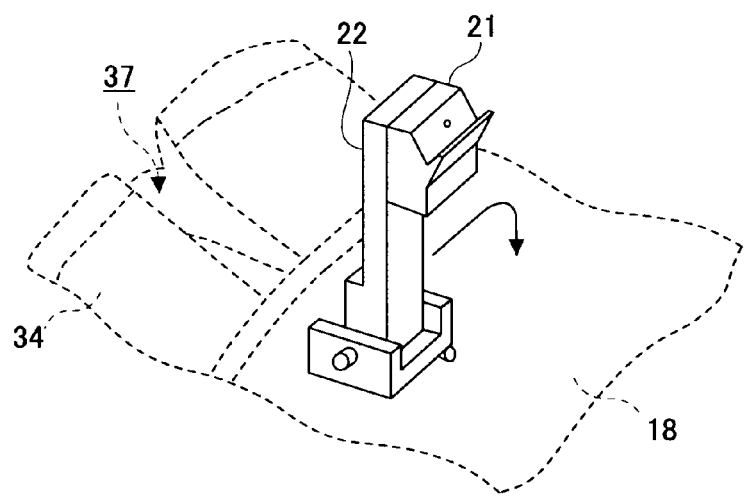
Figure 10C:
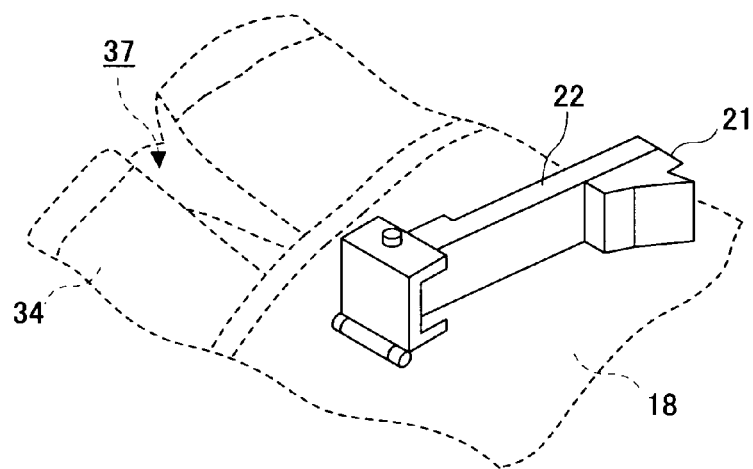
Figure 11A:
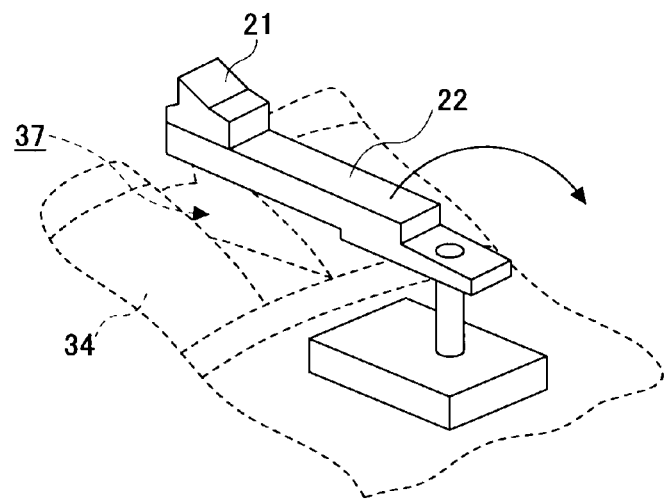
FIGS. 11A-11C are oblique view diagram showing a second modification of the cleaning mechanism.
Figure 11B:
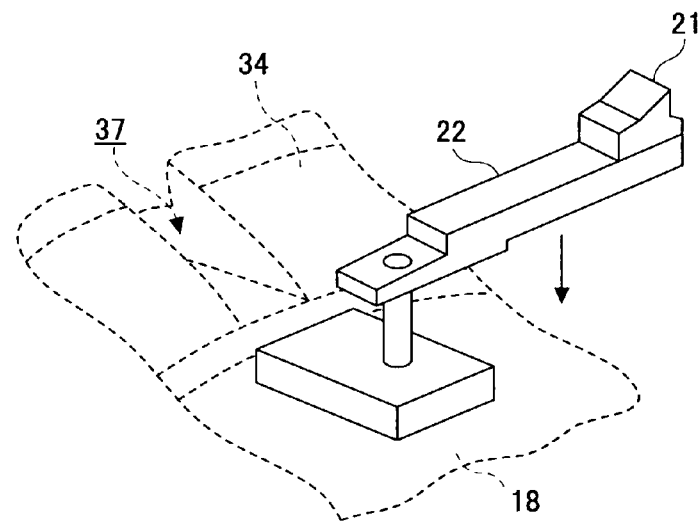
Figure 11C:
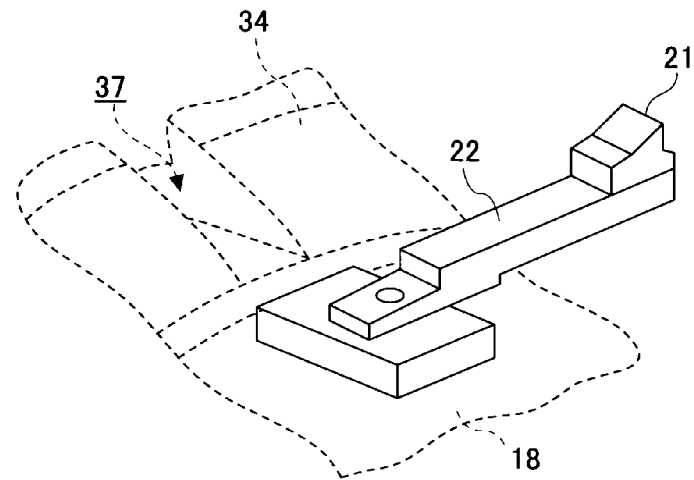

For example, it is also possible to construct the moving mechanism of the bevel cleaning mechanism 2 as shown in FIGS. 10A-10C, in which the cleaning nozzle 21 mounted upon the cutout part 37 as shown in FIG. 10A is moved to the retracted position shown in FIG. 10C by conducting a rotation operation causing a sideway tilting of the cleaning nozzle 21 after the arm part 22 is flipped up as shown in FIG. 10B. Alternatively, it is also possible to construct the moving mechanism of the bevel cleaning mechanism 2 as shown in FIGS. 11A-11C, in which the arm part 22 is moved upward from the state in which the cleaning nozzle 21 is mounted while maintaining the parallel relationship as shown in FIG. 11A, followed by rotating the arm part 22 sideways about the base part of the arm part 22 as shown in FIG. 11B, and further moving the cleaning nozzle 21 to the retracted position shown in FIG. 11C by lowering the entire arm part 22 while maintaining the parallel relationship. Further, it is also possible to provide a drive mechanism to the bevel cleaning mechanism 2 such that the bevel cleaning mechanism is moved automatically between the mounting position and the retracted position in response to the instruction of the operator. Further, while the foregoing embodiment has been explained for the case of the wafer W having the bevel part (inclined part) at the peripheral edge part thereof, it is of course possible to use the cleaning mechanism explained heretofore also to the cleaning of the wafer W not provided with such an inclined part at the peripheral edge part thereof.

Next, an example of applying the coating film forming apparatus 1 explained heretofore to a developing apparatus will be explained briefly.

Figure 12:
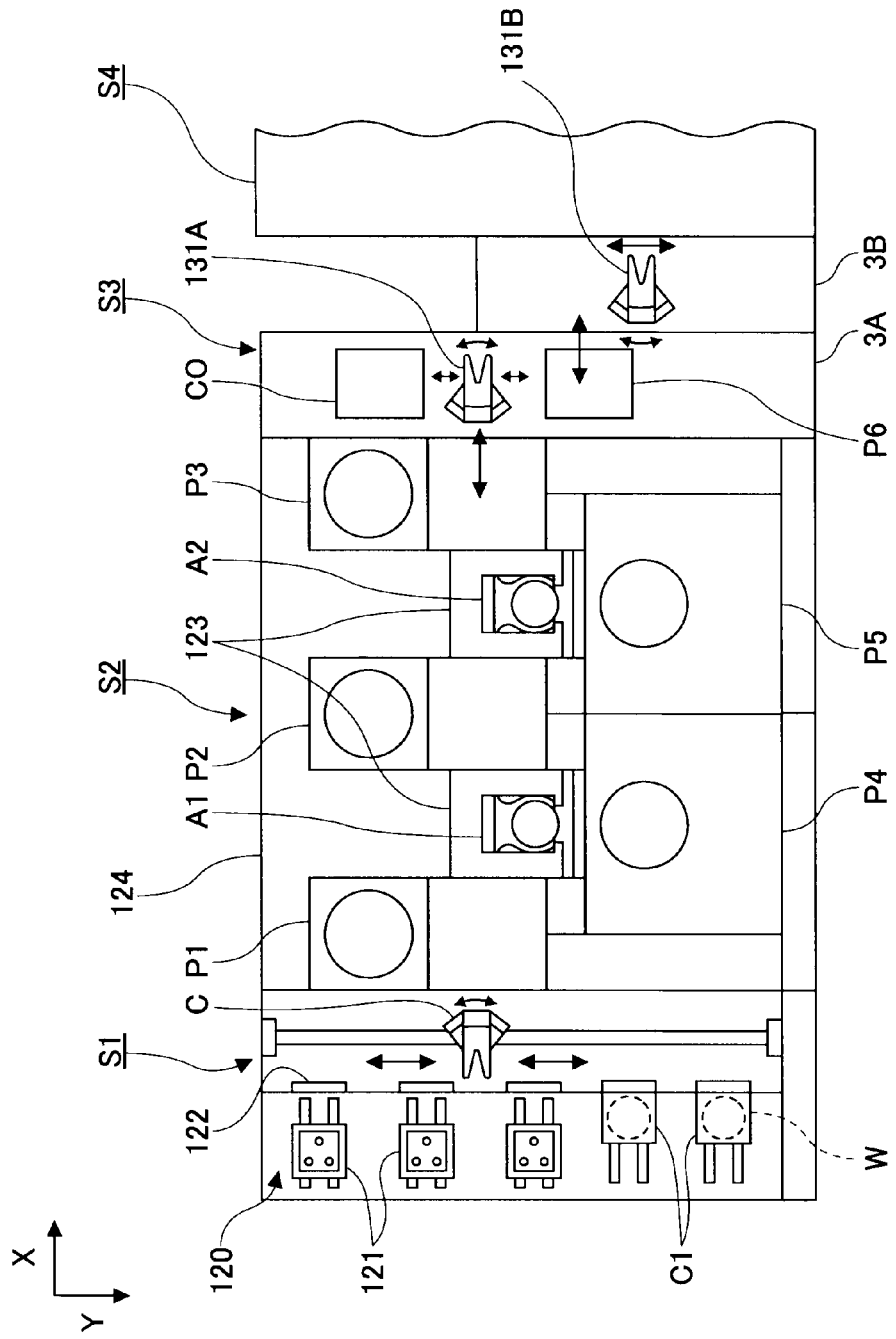
FIG. 12 is a plan view diagram showing a coating and developing apparatus that uses the coating film forming apparatus of the embodiment.
Figure 13:
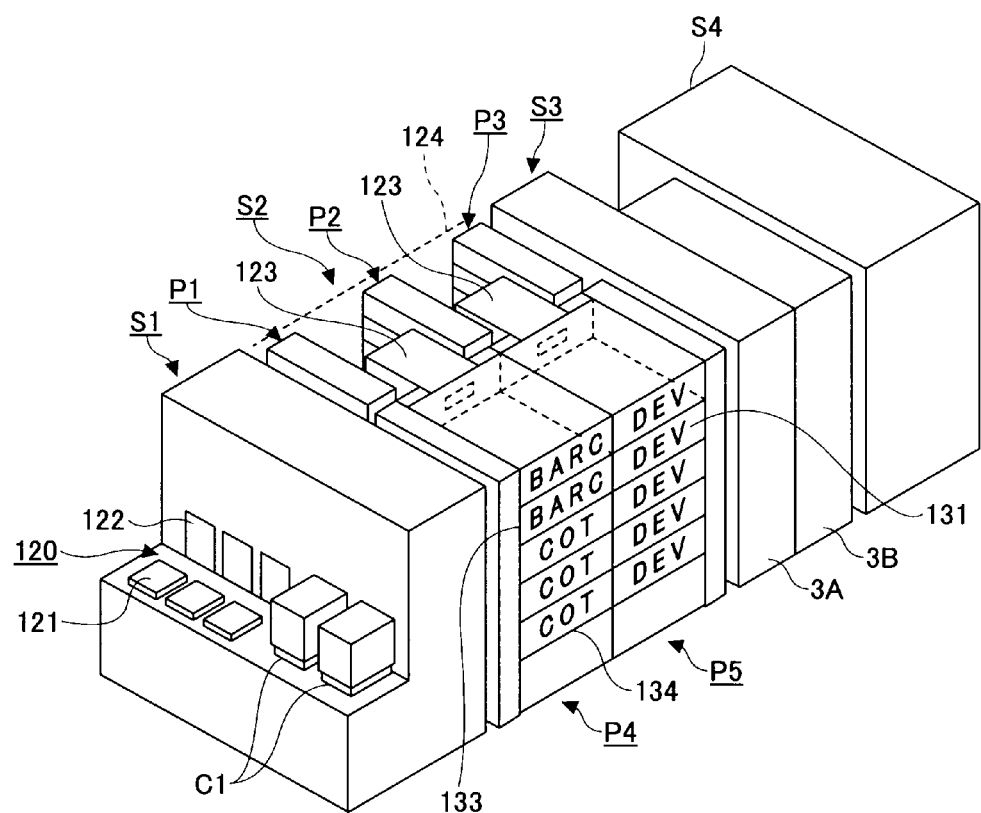
FIG. 13 is an oblique view diagram showing the external view of the coating and developing apparatus.

FIG. 12 is a plan view diagram showing a system in which an exposure apparatus is coupled to a coating and developing apparatus, while FIG. 13 is an oblique view diagram of the same system. Referring to FIGS. 12 and 13, the system includes a carrier block S1, wherein the carrier block S1 includes therein a carrier station 120 equipped with a table 121 used for loading and unloading carriers C1 each holding thirteen wafers W, for example, in airtight state, an open/close door 122 provided in the front wall of the carrier station 120, and a transfer arm C for taking out the wafer W from the carrier C1 through the open/close door 122.

Behind the carrier block S1, there is connected a processing block S2 surrounded by a housing 124, wherein the processing block S2 includes, from the front side toward the rear side, rack units P1, P2 and P3, liquid treatment units P4 and P5, and transfer arms A1 and A2 in an alternate relationship, wherein each rack units P1, P2 and P3 have heating and cooling units tiered in multiple shelves. Thereby, the transfer arms A1 and A2 play the role of transferring wafers W between these units. The transfer arms A1 and A2 are disposed in a space 123 defined by a side portion of the rack units P1, P2 and P3 disposed in a forward direction as viewed from the carrier block S1, a side portion of the liquid treatment units P4 and P5 disposed at the right side as viewed from the carrier block S1, and a partition wall disposed at the left side as viewed from the carrier block S1.

Each of the rack units P1, P2 and P3 have a construction of stacking various units for carrying out the pre-processing and post-processing that are carried out with the liquid treatment units P4 and P5. Such processing unit forming the stack includes a plurality of heating units (PAB) for baking the wafer W and cooling units for cooling the wafer W.

The liquid treatment units P4 and P5 may include therein various units such as bottom anti-reflection coating (BARC) application unit 133, a resist coating unit (COT) 134, a developing unit (DEV) 131, and the like, on a liquid holding part holding the resist liquid or developing liquid in the form of stack of multiple layers such as five layers. Here, it should be noted that each of the bottom anti-reflection coating application unit 133, the resist coating unit 134 and the developing unit 131 is constructed similarly to the coating film forming apparatus 1 of the embodiment described already with regard to the structure for removing the coating film applied to the bevel part of the wafer W.

Behind the processing block S2, there is provided an interface block S3 between the processing block S2 and an exposure block S4, wherein the interface block S3 is formed of a first transfer chamber 3A and a second transfer chamber 3B behind the first transfer chamber 3A. There, the first and second transfer chambers 3A and 3B include respectively wafer transfer mechanisms 131A and 131B in a manner movable up and down, rotatable about a vertical axis and movable forward and backward as desired.

Thereby, the first transfer chamber 3A is provided with a rack unit P6 and a buffer cassette CO. Further, the rack unit P6 has the construction of stacking, in vertical direction, the transfer stage (TRS) between the wafer transfer mechanism 131A and the wafer transfer mechanism 131B and a high precision temperature regulation unit including therein a heating unit (PEB) for heating the wafer after the exposure processing and a cooling plate.

Next, the flow of wafer processing conducted with the coating and developing apparatus of FIGS. 10 and 12. First a carrier C1 accommodating therein a wafer W is incorporated into the carrier block S1 from outside. There, the wafer W is transferred along the path of: transfer arm C→transfer unit (TRS) of the rack unit P1→transfer arm A1→bottom antireflection coating (BARC) application unit 133→transfer arm A1→heating unit→transfer means A1→cooling unit→hydrophobic processing unit→transfer arm A1→cooling unit→transfer arm A1→resist coating unit (COT) 134→transfer arm A1→heating unit→transfer arm A1→cooling unit→transfer arm A2→transfer unit (TRS) of rack unit P3→wafer transfer mechanism 131A→transfer unit (TRS) of rack unit P6→wafer transfer mechanism 131B→exposure unit S4.

After the exposure processing, the wafer W is transferred along the path of: wafer transfer mechanism 131B→transfer stage (TRS) of the rack unit P6→wafer transfer mechanism 131A→heating unit of rack unit P6→wafer transfer mechanism 131A→temperature regulation unit of rack unit P6→wafer transfer mechanism 131A→transfer stage (TRS) of rack unit P3→transfer arm A2→developing unit 131→transfer arm A2→heating unit→transfer arm A1 (A2)→cooling unit→transfer arm A1→transfer unit (TRS) of rack unit P1→transfer arm C. Further, the wafer W is returned to the carrier C1, and the coating and developing process is completed.

In the case of forming a protective film on the surface of the resist film, it is preferable to use a part of the liquid treatment unit of P4 or P5 as the protective film application unit. Thereby, the resist film is formed in the resist coating unit (COT) 134, and the protective film is formed by the protective film application unit in the interval of transferring the substrate to the exposure unit S4.

While the present invention has been explained for preferred embodiments, the present invention is not limited to such specific embodiments and various variations and modifications may be made within the scope of the invention described in patent claims.

What is claimed is:

1. A method of forming a coating film comprising using a coating film forming apparatus comprising an outer cup provided detachably to surround a spin chuck, an inner cup provided detachably to surround a region underneath a substrate held upon said spin chuck, said method comprising the steps of:

mounting a cleaning nozzle, to which a cleaning liquid supply tube is connected, upon a nozzle mounting cutout part provided to said inner cup in engagement therewith such that said cleaning liquid is supplied from a supply aperture toward a peripheral edge part of a bottom surface of said substrate obliquely in an upward direction from an inner side region to said peripheral edge part of said bottom surface, said cutout part being cut out in a top part of said inner cup to extend from an inner surface to an outer surface of said inner cup, said cutout part being formed such that said supply aperture is located at a side of said outer surface of said inner cup;

holding a substrate upon said spin chuck and forming a coating film by supplying a chemical liquid upon said substrate;

cleaning a peripheral edge part of said substrate by supplying a cleaning liquid from said cleaning nozzle to a peripheral part of a bottom surface of said substrate while rotating said spin chuck;

dismounting said cleaning nozzle from said inner cup in a state in which said cleaning liquid supply tube is connected thereto; and removing said inner cup.

2. The method as claimed in claim 1, wherein said cleaning nozzle is formed to have a shape corresponding to a shape of an outer surface of said inner cup such that said cleaning nozzle constitutes a part of said inner cup when mounted upon said cutout part.

3. The method as claimed in claim 2, wherein there is formed a projection piece for blocking of invasion of mist at the top edge of the inner cup so as to project outward and upward obliquely along a circumference of said inner cup, and wherein a part of said cleaning nozzle functions as a part of said projection piece.

4. The method as claimed in claim 3, wherein a top part of said inner cup is formed to have a shape of a mound in an elevational cross-sectional diagram and said projection piece is formed to extend outward from an apex of said mound-shape part, said cleaning nozzle having an upward inclined oblique surface part and a downward inclined oblique surface part and wherein said cleaning liquid is ejected from a part between upward inclined oblique surface part and said downward inclined oblique surface part.

5. The method as claimed in claim 4, wherein said step of dismounting said cleaning nozzle from said inner cup in a state said cleaning liquid supply tube is connected thereto comprises the step of retracting said cleaning nozzle from said position in which said cleaning nozzle is mounted upon said cutout part of said inner cup to an inner position inside said inner periphery of said inner cup by way of at least one of a rotational operation and a sliding operation caused by a moving mechanism.

6. The method as claimed in claim 3, wherein said step of dismounting said cleaning nozzle from said inner cup in a state said cleaning liquid supply tube is connected thereto comprises the step of retracting said cleaning nozzle from said position in which said cleaning nozzle is mounted upon said cutout part of said inner cup to an inner position inside said inner periphery of said inner cup by way of at least one of a rotational operation and a sliding operation caused by a moving mechanism.

7. The method as claimed in claim 2, wherein said step of dismounting said cleaning nozzle from said inner cup in a state said cleaning liquid supply tube is connected thereto comprises the step of retracting said cleaning nozzle from said position in which said cleaning nozzle is mounted upon said cutout part of said inner cup to an inner position inside said inner periphery of said inner cup by way of at least one of a rotational operation and a sliding operation caused by a moving mechanism.

8. The method as claimed in claim 1, wherein said step of dismounting said cleaning nozzle from said inner cup in a state said cleaning liquid supply tube is connected thereto comprises the step of retracting said cleaning nozzle from said position in which said cleaning nozzle is mounted upon said cutout part of said inner cup to an inner position inside said inner periphery of said inner cup by way of at least one of a rotational operation and a sliding operation caused by a moving mechanism.

\* \* \* \* \*